United States Patent
Ohshima et al.

(10) Patent No.: US 7,439,819 B2
(45) Date of Patent: Oct. 21, 2008

(54) PIEZOELECTRIC-OSCILLATOR

(75) Inventors: Tsuyoshi Ohshima, Kouza-gun (JP);
Shigehisa Kurogo, Kouza-gun (JP);
Masayuki Ishikawa, Kouza-gun (JP);
Susumu Kurosawa, Kawasaki (JP);
Yuki Fujimoto, Kawasaki (JP);
Yasutaka Nakashiba, Kawasaki (JP)

(73) Assignees: Epson Toyocom Corporation, Tokyo (JP); NEC Electronics Corporation, Kanagawa (JP)

( * ) Notice: Subject to any disclaimer, the term of this patent is extended or adjusted under 35 U.S.C. 154(b) by 56 days.

(21) Appl. No.: 10/566,287

(22) PCT Filed: Aug. 3, 2004

(86) PCT No.: PCT/JP2004/011096

§ 371 (c)(1),
(2), (4) Date: Jan. 27, 2006

(87) PCT Pub. No.: WO2005/013475

PCT Pub. Date: Feb. 10, 2005

(65) Prior Publication Data

US 2006/0208816 A1  Sep. 21, 2006

(30) Foreign Application Priority Data

Aug. 5, 2003  (JP)  ............... 2003-287153

(51) Int. Cl.
*H03B 5/32* (2006.01)
*H03B 5/12* (2006.01)

(52) U.S. Cl. ............... 331/158; 331/36 C; 331/116 R; 331/176; 331/177 V; 257/312

(58) Field of Classification Search ............... 331/36 C, 331/116 R, 116 FE, 108 A, 158, 160, 176, 331/177 R, 177 V, 185; 257/312
See application file for complete search history.

(56) References Cited

U.S. PATENT DOCUMENTS

| 4,851,792 A | 7/1989 | Ochiai |
| 6,040,744 A | 3/2000 | Sakurai |
| 6,320,474 B1 * | 11/2001 | Kamiya et al. ........... 331/177 V |
| 6,734,747 B1 * | 5/2004 | Ishikawa et al. ............ 331/158 |
| 2004/0056725 A1 * | 3/2004 | Kitamura et al. .......... 331/36 C |

FOREIGN PATENT DOCUMENTS

| DE | 100 50 641 | 4/2001 |
| JP | 61-95104 | 6/1986 |
| JP | 2000-252480 | 9/2000 |
| JP | 2001-60868 | 3/2001 |
| JP | 2002-57526 | 2/2002 |

* cited by examiner

*Primary Examiner*—Robert Pascal
*Assistant Examiner*—Ryan J Johnson
(74) *Attorney, Agent, or Firm*—William L. Androlia; H. Henry Koda

(57) ABSTRACT

Deterioration in frequency stability with time in a conventional piezoelectric oscillator using an accumulation type MOS capacitance element is improved. A P-channel transistor type or an N-channel transistor type is used as a MOS capacitance element in a variable capacitance circuit used in a piezoelectric oscillator. A bias voltage is applied between P-type or N-type extraction electrodes formed in source and drain regions and an N-type extraction electrode provided in an N-well region or a P-type extraction electrode provided in a P-well region. Instability in the MOS capacitance element with time is thus eliminated.

9 Claims, 15 Drawing Sheets

[FIG.1]
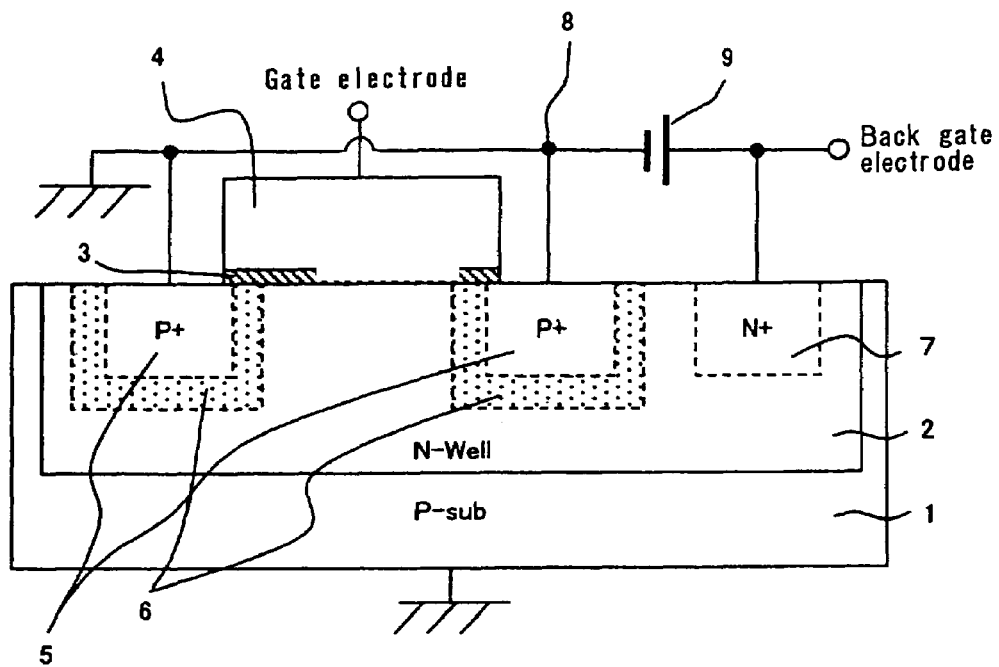
[FIG.2]
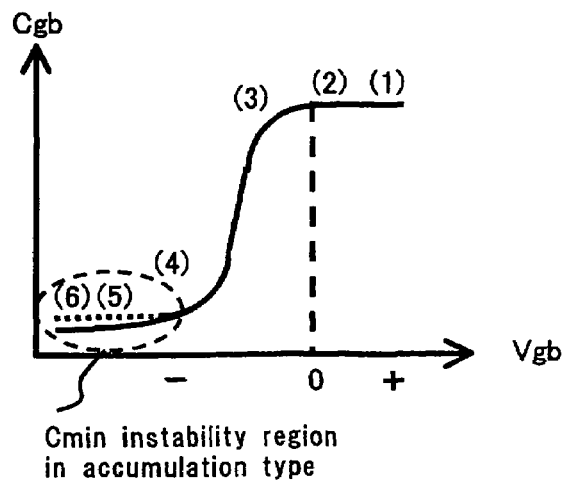
Cmin instability region
in accumulation type

[FIG.3]
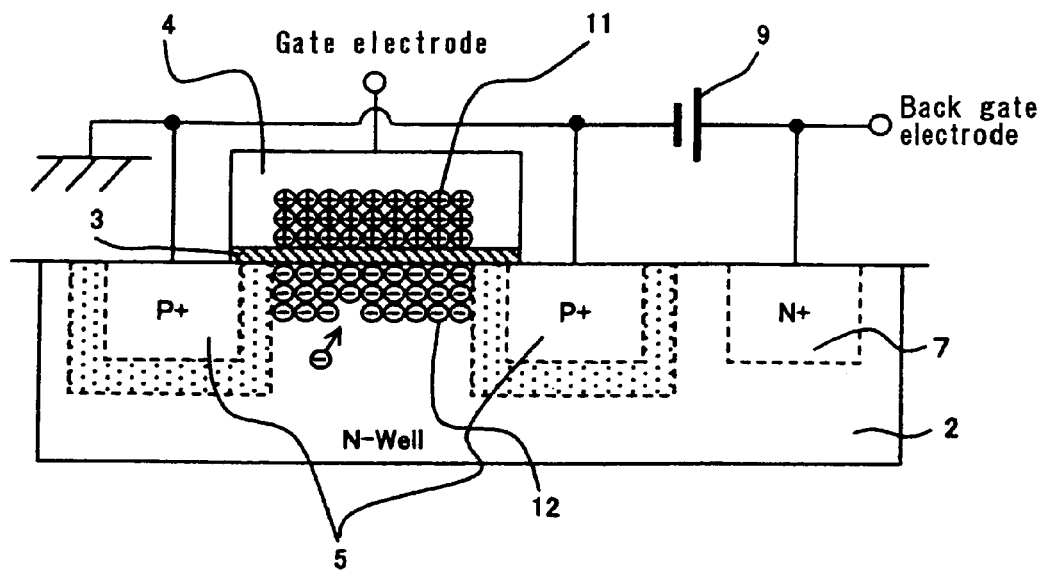
[FIG.4]
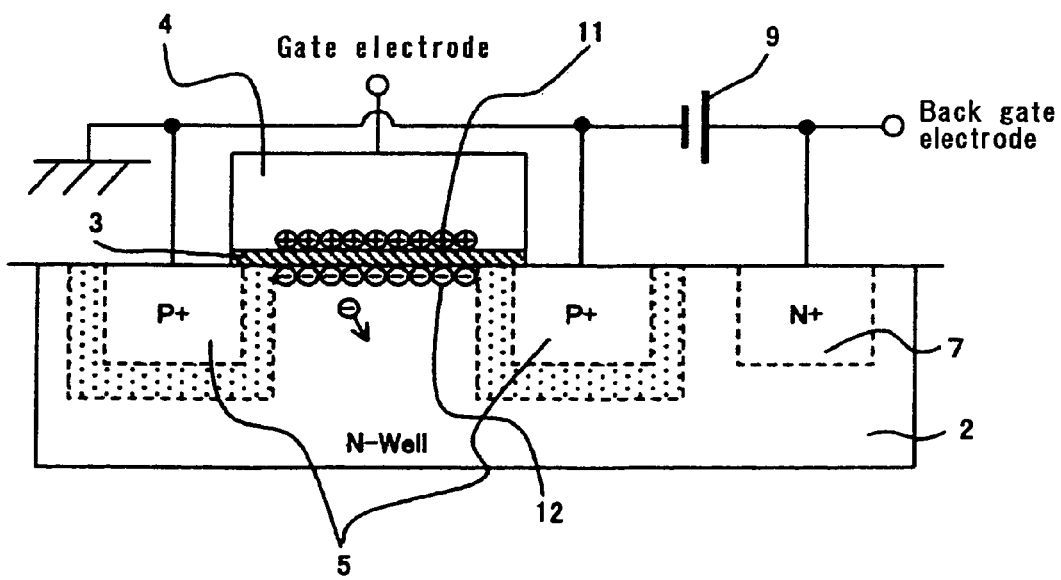

[FIG.5]
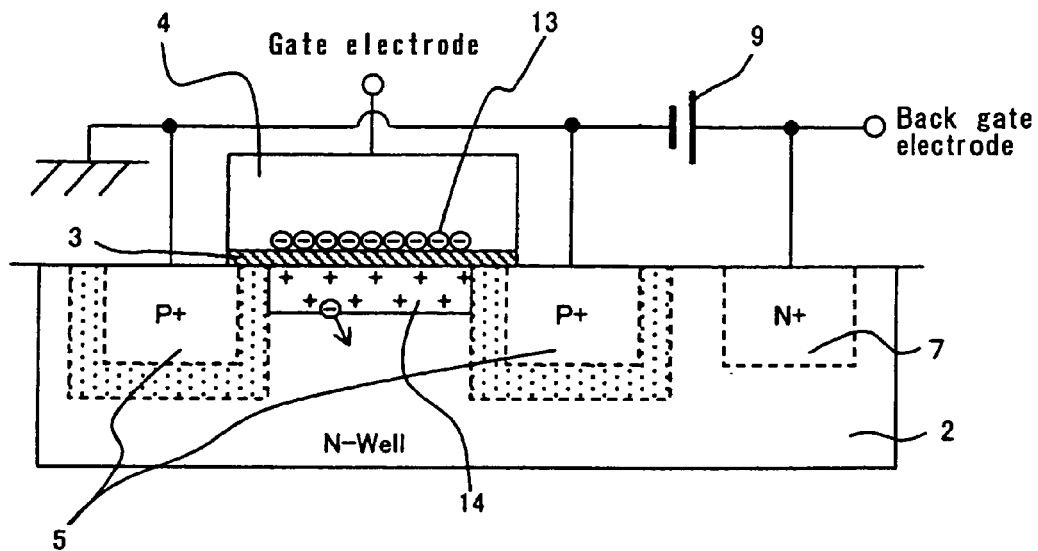
[FIG.6]
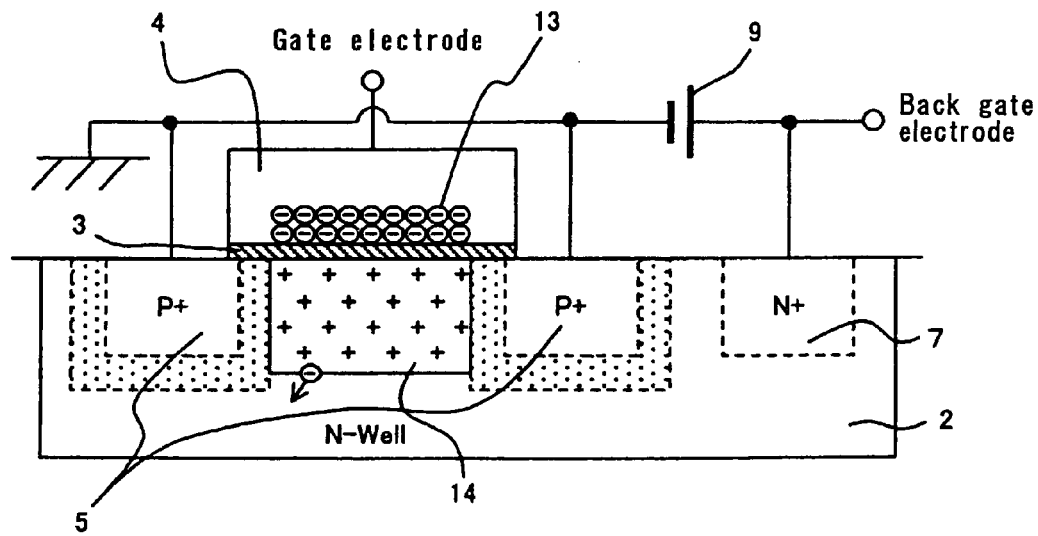

[FIG.7]
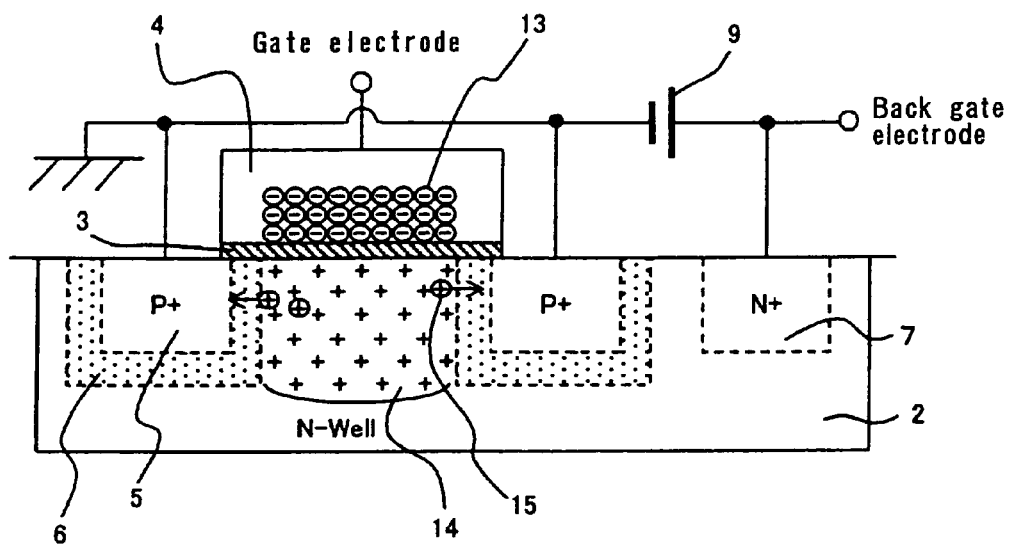
[FIG.8]
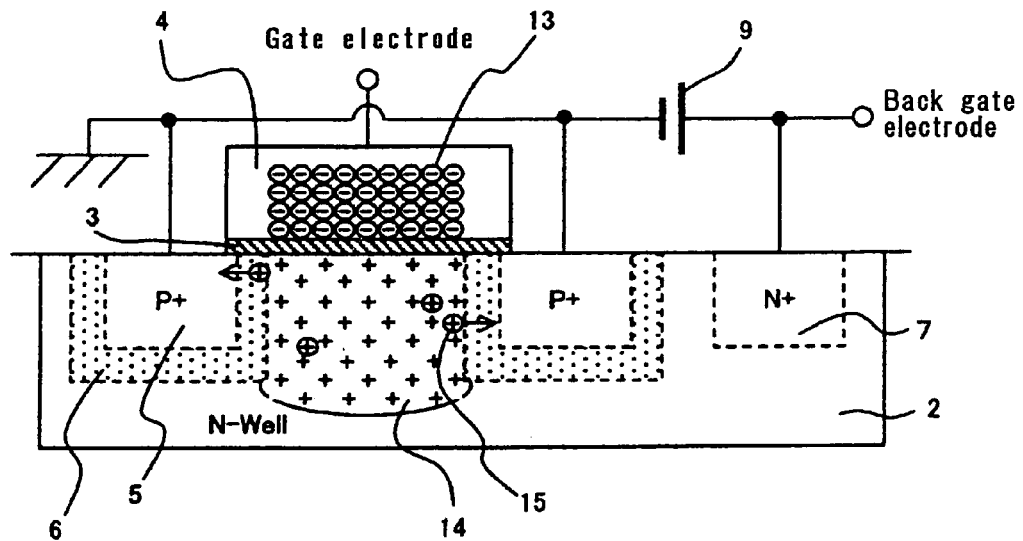

[FIG.9]
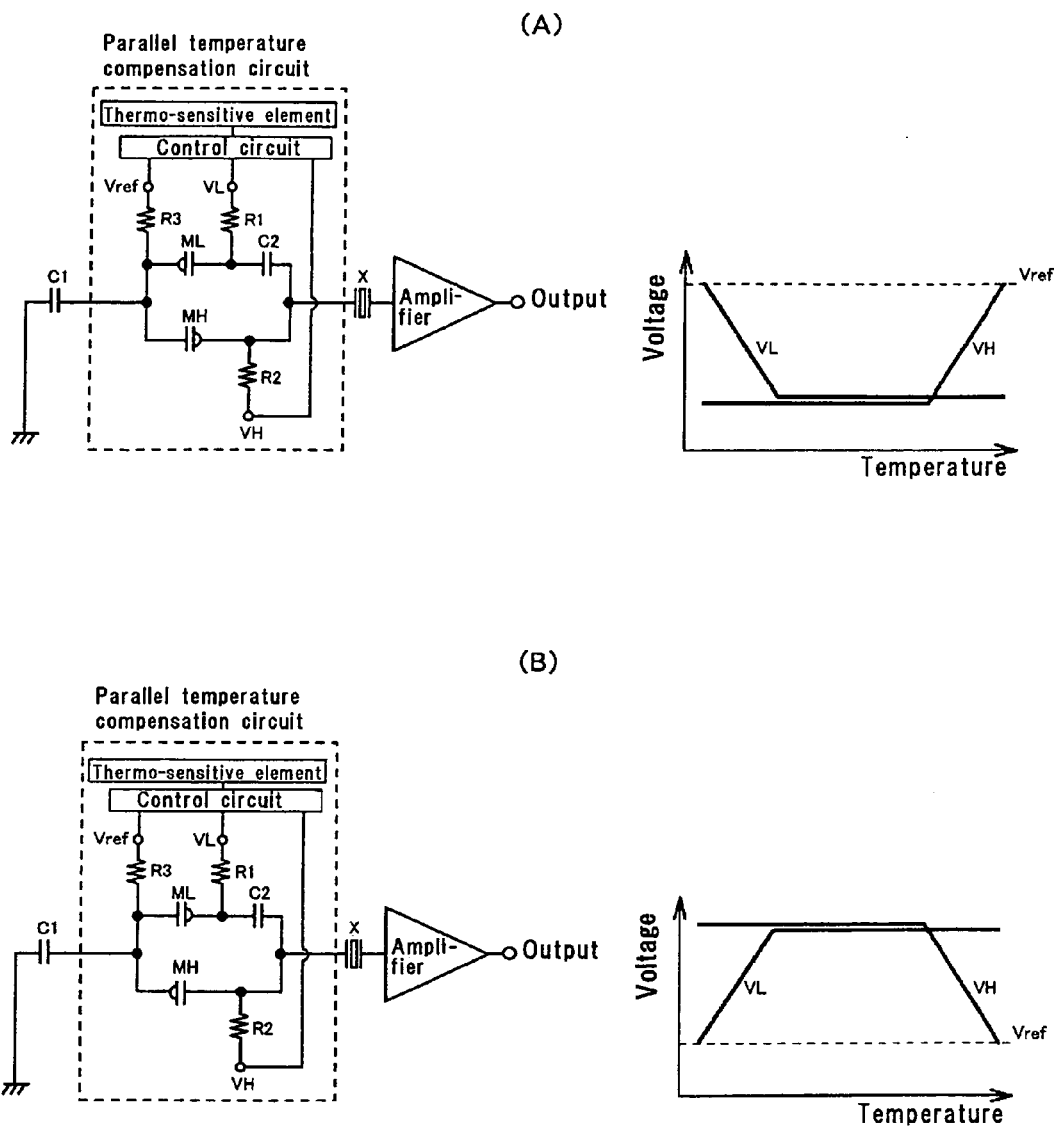

[FIG.10]
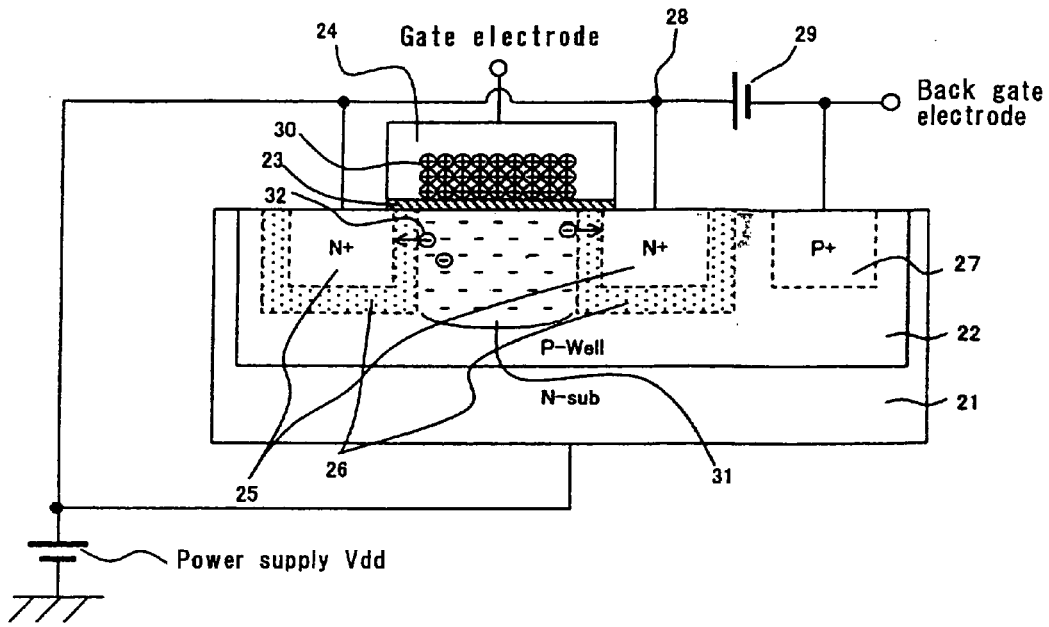
[FIG.11]
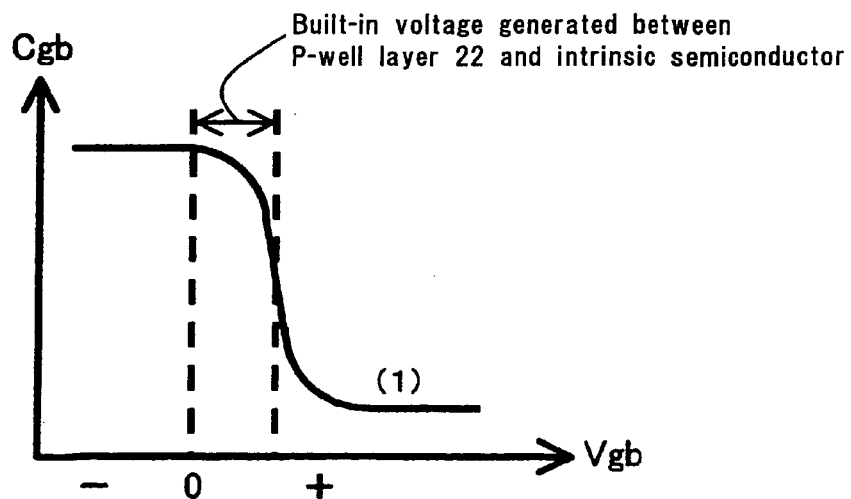

[FIG.12]
Prior Art
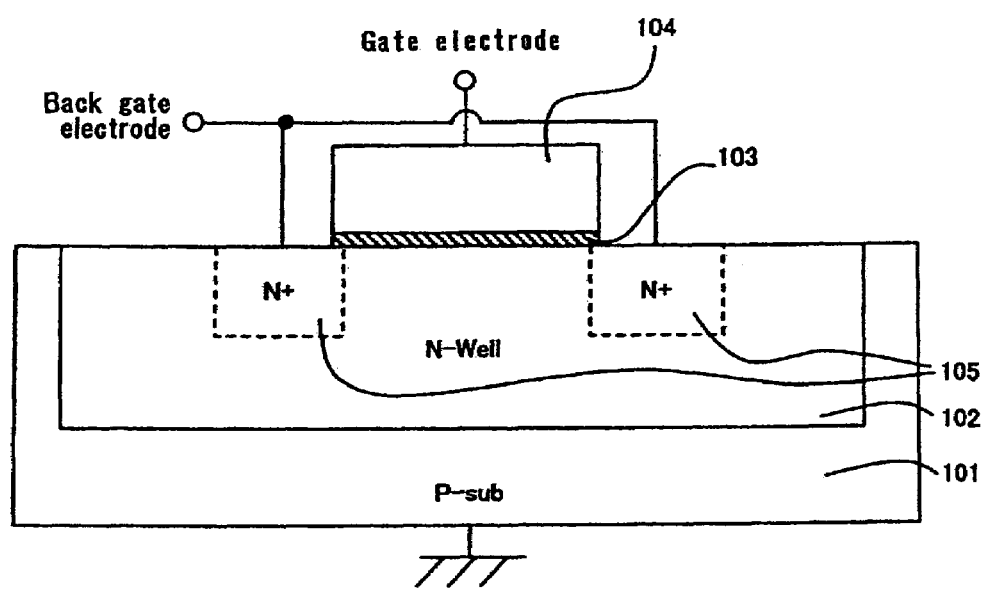
[FIG.13] Prior Art
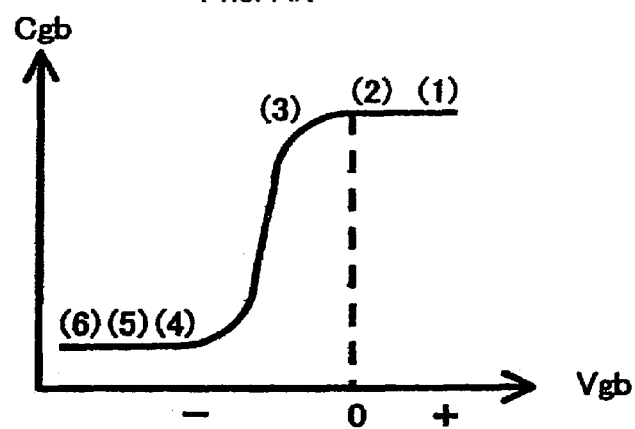

[FIG.14]
Prior Art
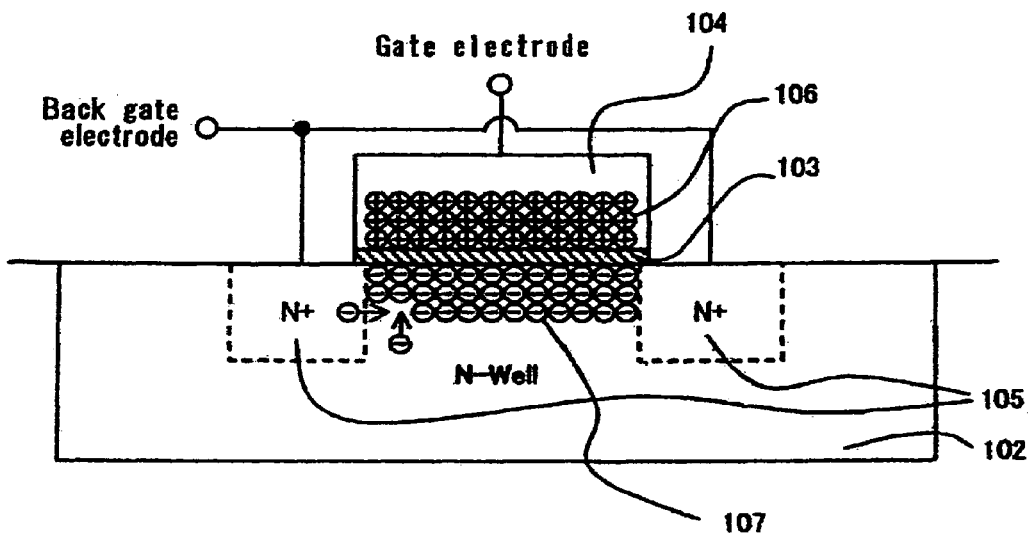
[FIG.15]
Prior Art
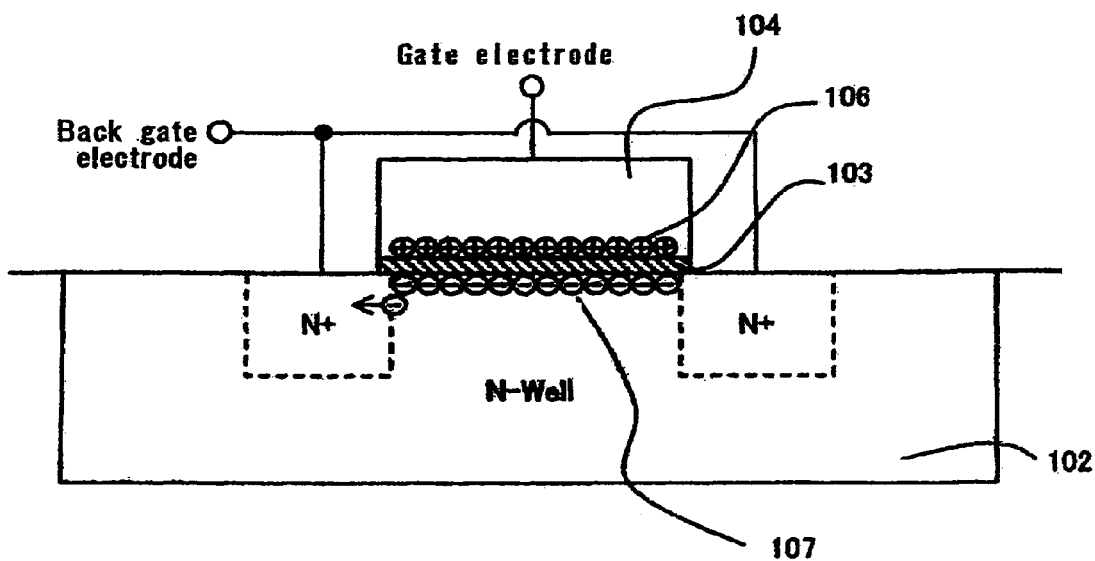

[FIG.16]
Prior Art
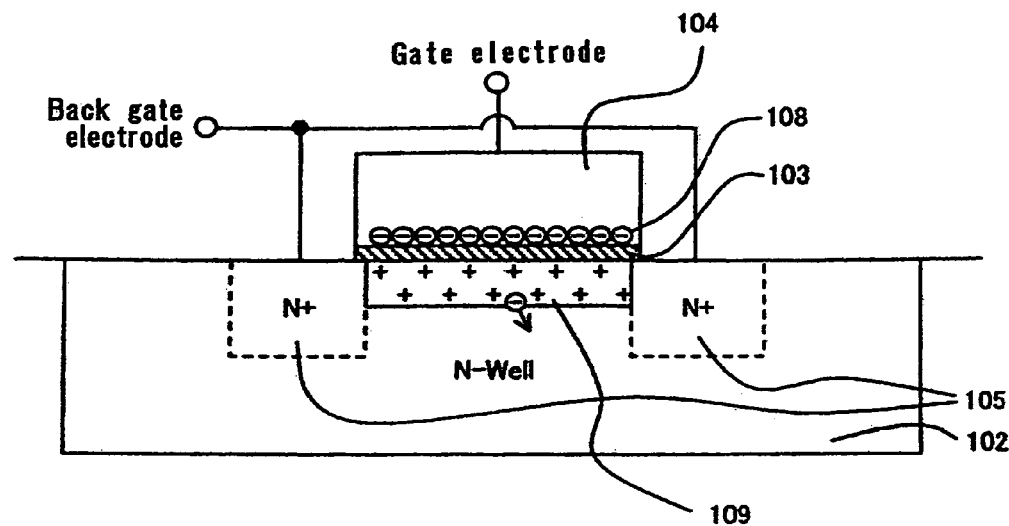
[FIG.17]
Prior Art
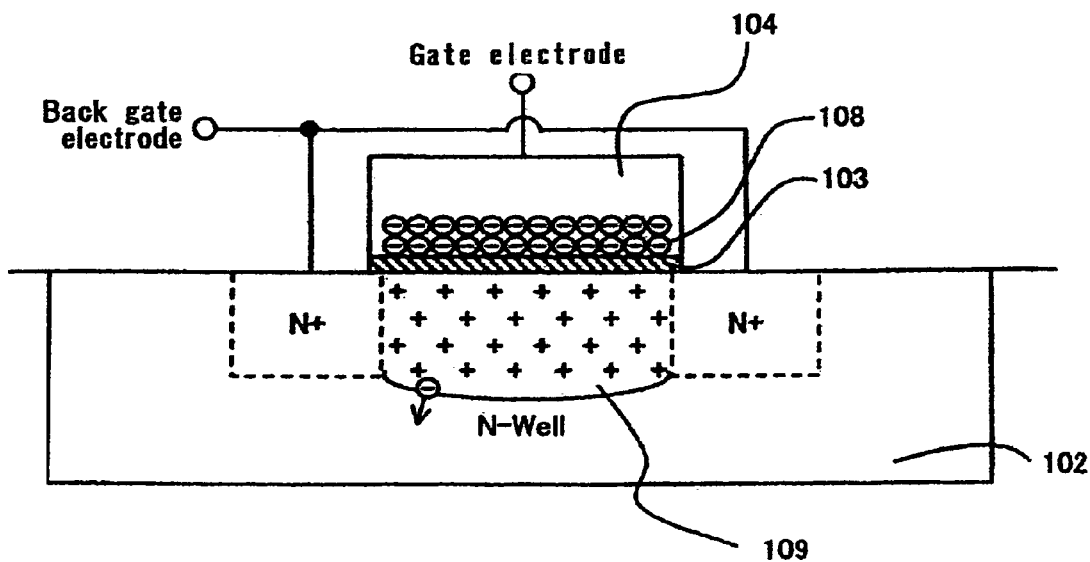

[FIG.18]
Prior Art
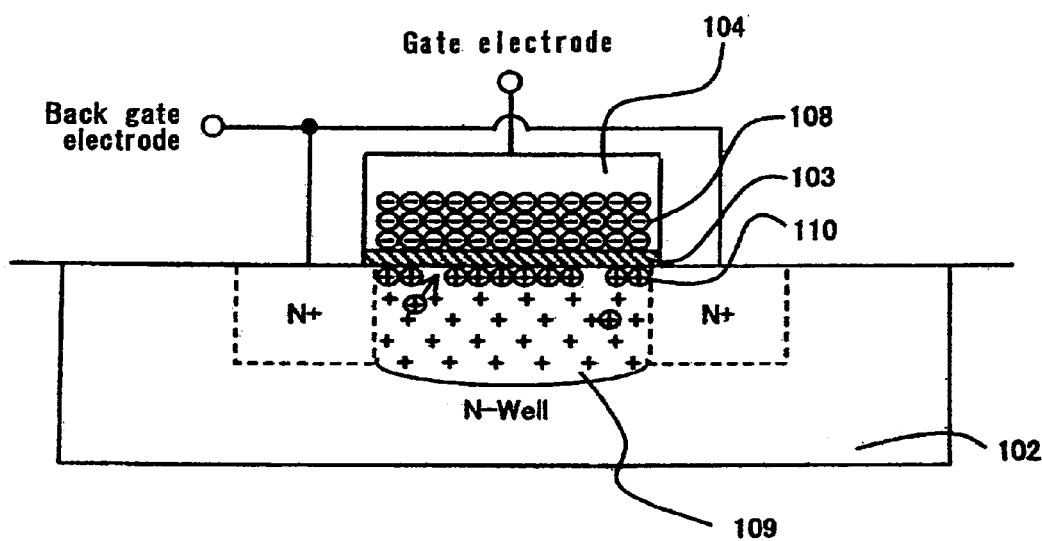
[FIG.19]
Prior Art
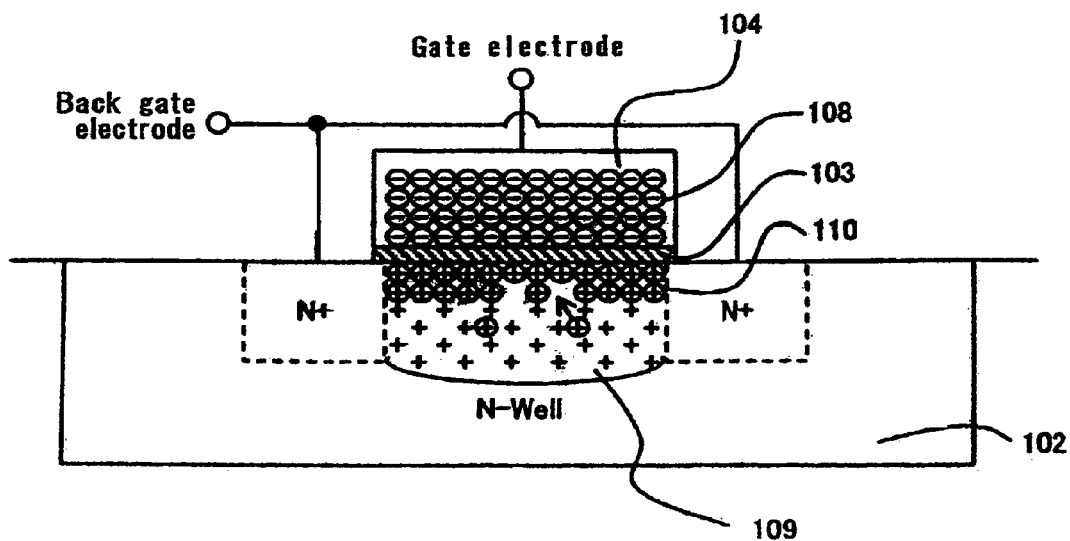

[FIG.20]
Prior Art
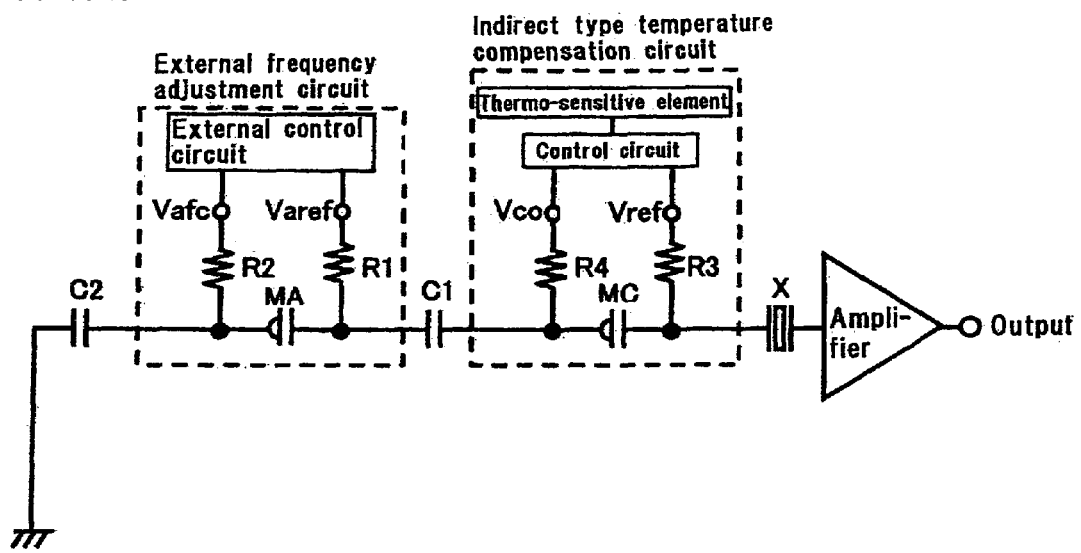
[FIG.21]
Prior Art
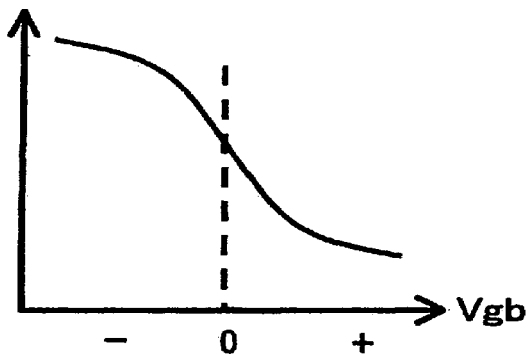

[FIG.22]
Prior Art
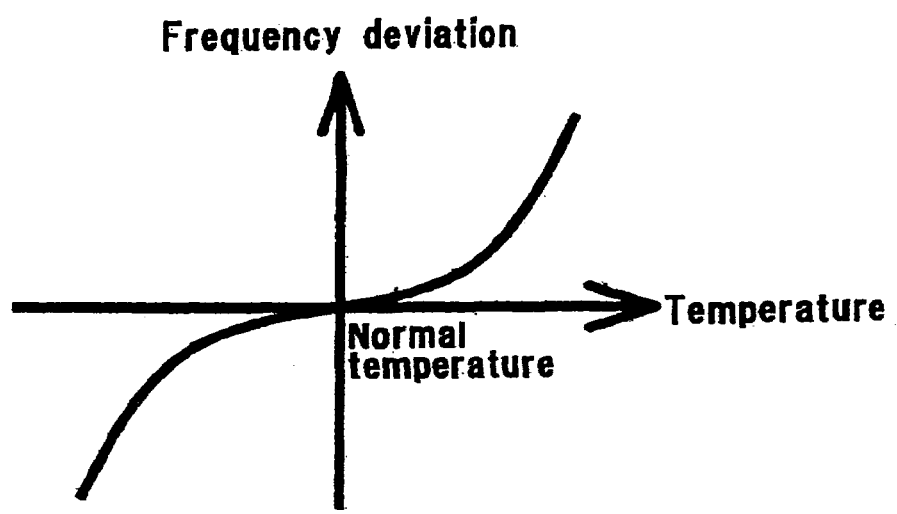

[FIG.23]
Prior Art
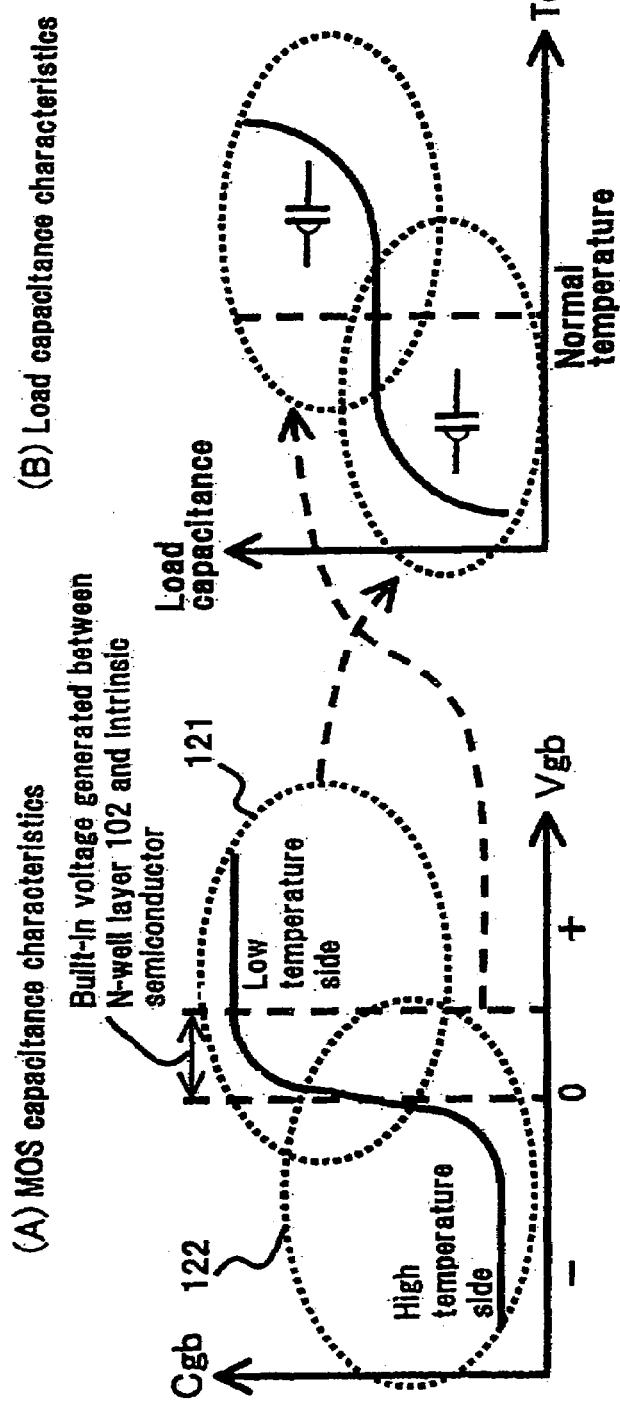

[FIG.24]
Prior Art
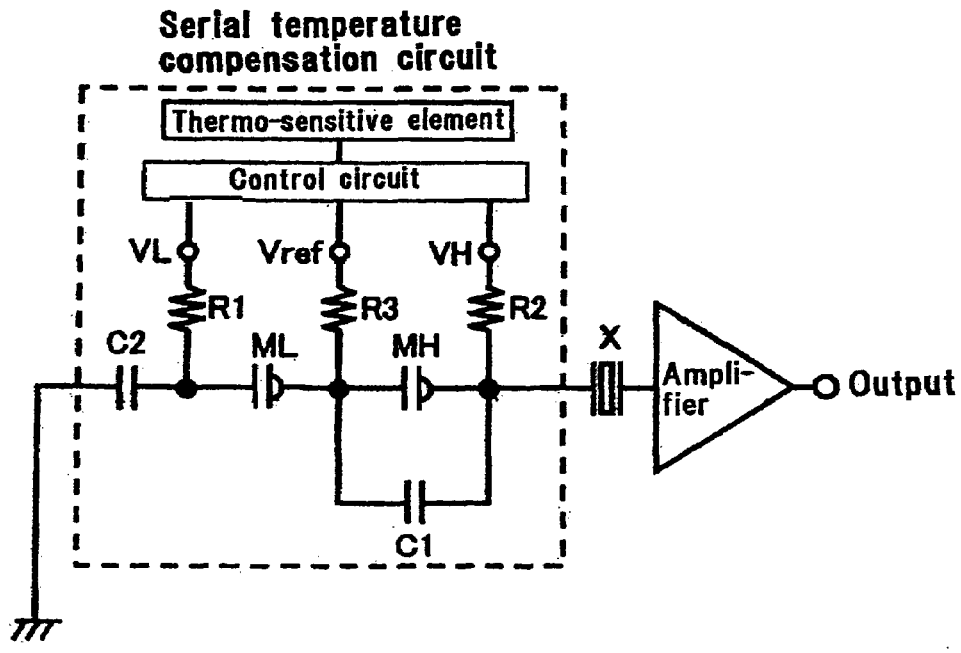
[FIG.25]
Prior Art
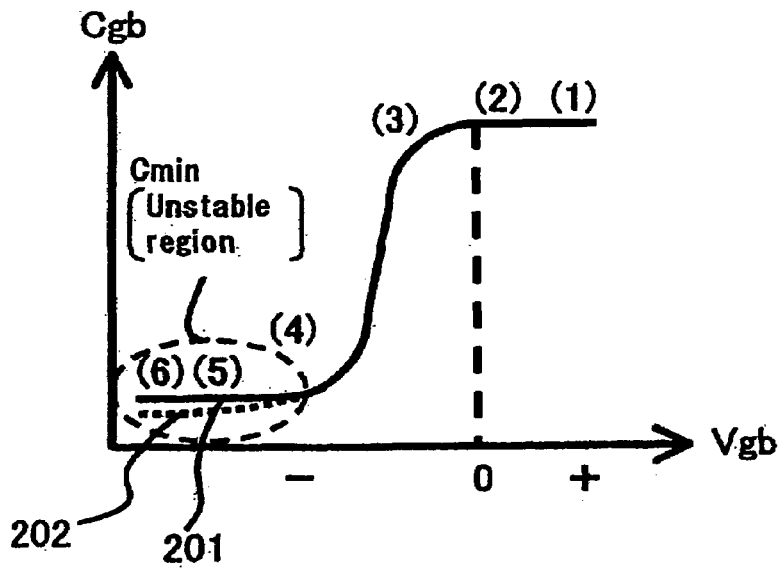

[FIG.26]
Cmin capacitance value leaving experiments (initial voltage = +4 V)
$\begin{pmatrix} \text{Executed after being left for approximately two minutes at initial} \\ \text{voltate} \end{pmatrix}$
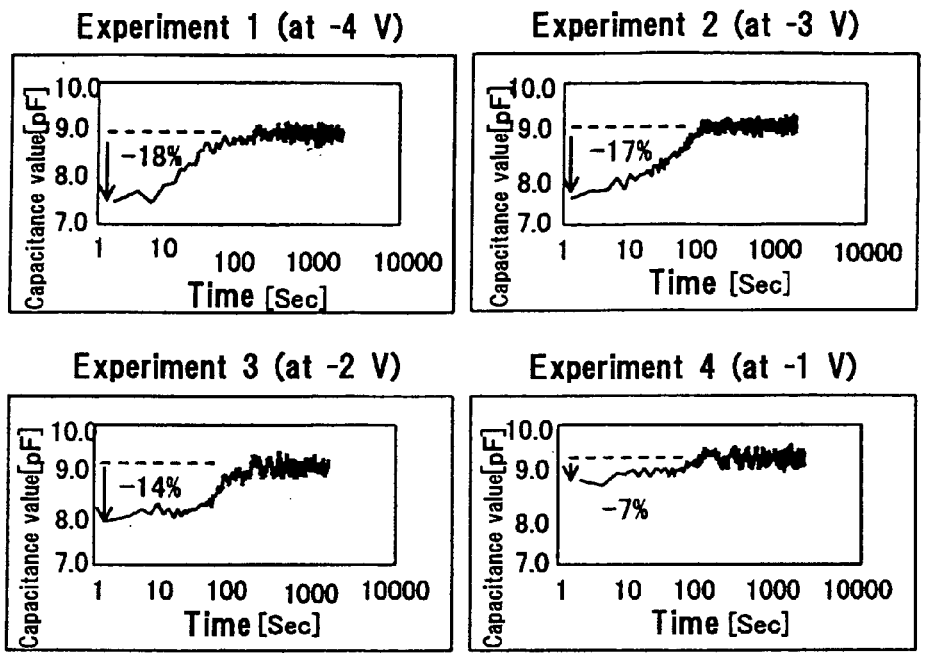
※ The variation is large as Vgb becomes lower.
However, the stabilization time is always approximately 100 seconds.
[FIG.27]
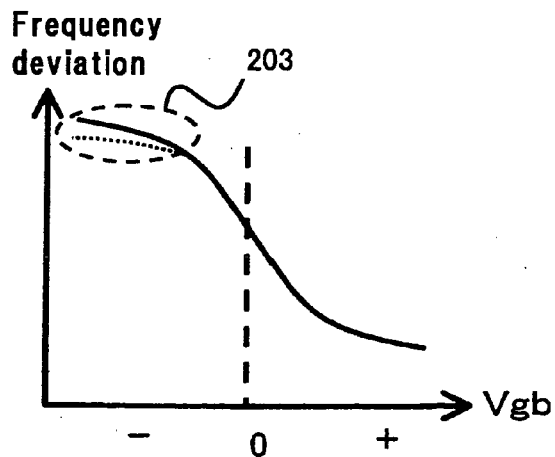

PIEZOELECTRIC-OSCILLATOR

TECHNICAL FIELD

The present invention relates to a piezoelectric oscillator, and particularly to a piezoelectric oscillator using a variable capacitance circuit that utilizes a MOS capacitance element for frequency voltage control, frequency temperature compensation or the like.

BACKGROUND ART

An element attracting attention at present as a variable capacitance element replacing the variable capacitance diode is a MOS capacitance element. In application to a temperature compensated crystal oscillator (hereinafter referred to as TCXO) used for, for example, portable telephones or the like, the MOS capacitance element has a feature that a large capacitance change is obtained even if a voltage change is slight. Even in situations where the voltage used for oscillation circuits becomes low and the voltage that can be applied to the variable capacitance element must be made low, therefore, the MOS capacitance element has sufficient capacitance characteristics in practical use.

FIG. 12 shows a structure of a conventional MOS capacitance element provided in an IC. This is a structure diagram of a MOS capacitance element called accumulation type. In FIG. 12, a P-type silicon substrate (P-Sub) 101 is grounded. Over the P-type silicon substrate 101, an N-well layer 102, a gate oxide film layer 103 including oxide silicon which serves as an insulator, and a gate electrode layer 104 including polysilicon or the like, are formed. A gate electrode is taken out from the gate electrode layer 104 as an external terminal. N-type extraction electrodes having a high donor impurity concentration (hereinafter referred to as N+ electrodes) 105 (serving as drain and source regions in a MOS transistor) are formed in two places near the gate oxide film layer 103 on the N-well layer 102. The N-type extraction electrodes are short-circuited, and a back gate electrode is taken out as an external terminal.

FIG. 13 shows an example of characteristics of the accumulation type MOS capacitance element showing a capacitance value Cgb generated between the back gate electrode and the gate electrode (hereinafter referred to as Cgb) as a function of a gate voltage Vgb measured from a back gate voltage (hereinafter referred to as Vgb). In this characteristic curve, Cgb represented by the ordinate axis assumes a high constant value when Vgb represented by the abscissa axis is on the plus side. If Vgb decreases and becomes lower than 0 V, Cgb steeply decreases. If Vgb decreases to a certain value, Cgb becomes stable at a low constant value.

Actually, this characteristic curve shifts to the left or right by a flat band voltage Vfb due to influence of a potential difference caused by an impurity concentration difference between the gate electrode layer 104 and the N-well layer 102 or electric charges such as sodium ions in the gate oxide film layer 103. In the ensuing description, Vfb is supposed to be 0 V.

Hereinafter, a relative change of electric charge quantity in the gate electrode layer 104 and the N-well layer 102 caused when Vgb is decreased successively from (1) to (6) shown in FIG. 13 will be described in detail as a change in number of holes or electrons with reference to schematic drawings.

FIG. 14 is a schematic diagram showing relative electric charge states in the gate electrode layer 104 and the N-well layer 102 when Vgb nearly assumes a value on the plus side corresponding to (1) shown in FIG. 13 and Cgb assumes a high stable constant value. Holes 106 are stored in the gate electrode layer 104 shown in FIG. 14 because Vgb is on the plus side. Electrons which are majority carriers in the N+ electrode 105 and the N-well layer 102 attracted to an electric field of the holes 106 are stored under the gate oxide film layer 103 by an amount of electric charge quantity equivalent to the total electric charge quantity of the holes 106. Thus, an electron storage layer 107 is formed. Therefore, capacitance Cgb which is in inverse proportion to the thickness of the gate oxide film layer 103 is generated here (hereinafter it is referred to as gate oxide film capacitance).

FIG. 15 shows a state in which Vgb has decreased to a value nearly corresponding to (2) shown in FIG. 13. The holes stored in the gate electrode layer 104 decrease, and consequently electrons in the electron storage layer 107 attracted under the gate oxide film layer 103 also decrease. Cgb generated by the value of Vgb between (1) and (2) shown in FIG. 13 is gate oxide film capacitance, and it becomes a constant value.

FIG. 16 shows a state in which Vgb has decreased to a value slightly on the minus side than 0 V nearly corresponding to (3) shown in FIG. 13. The holes 106 stored in the gate electrode layer 104 are replaced by electrons 108. Consequently, the electrons in the electron storage layer 107 are absorbed mainly into the N+ electrode 105. Free electrons stored in the N-well layer 102 under the gate oxide film layer 103 are emitted into a deep layer in the N-well layer 102. Therefore, a depletion layer 109 including donor ions is formed under the gate oxide film layer 103. Accordingly, Cgb becomes series composite capacitance of the gate oxide film capacitance and depletion layer capacitance, and it consequently decreases.

FIG. 17 shows a state in which Vgb has decreased to a value nearly corresponding to (4) shown in FIG. 13. At this time, the depletion layer 109 expands its width as the electrons 108 in the gate electrode layer 104 increases. The value of Cgb is steeply decreased by an increase in the depletion layer width caused by the decrease in Vgb.

FIG. 18 shows a state in which Vgb is further decreased to a value nearly corresponding to (5) in FIG. 13 at which Vgb becomes a certain value (a value at which a voltage that is twice as high as built-in voltage generated between the N-well layer 102 and the intrinsic semiconductor is applied to the depletion layer 109) or less. In the depletion layer 109 at this time, holes which are minority carriers generated by thermally generated electron-hole pairs are subjected to force by the electric field in the depletion layer 109, and stored under the gate oxide film layer 103 to form an inversion layer 110. Therefore, the width of the depletion layer 109 does not increase, but becomes equivalent to the width shown in FIG. 17.

On the other hand, since generation of the thermal carriers relates to the increase and decrease of holes in the inversion layer 110, a definite time is needed. In the case of use in high frequency, therefore, the MOS capacitance element does not contribute as capacitance. Accordingly, the increase and decrease of electric charge at high frequencies are conducted only at ends of the depletion layer 109. When Vgb changes from (4) to (5) shown in FIG. 13, the value of Cgb does not change.

FIG. 19 shows a state in which Vgb has decreased to a value nearly corresponding to (6) shown in FIG. 13. Since holes included in the inversion layer 110 increase exponentially as Vgb decreases, the width of the depletion layer 109 does not change. Therefore, Cgb becomes constant with respect to Vgb.

In the example of capacitance characteristics shown in FIG. 13, the capacitance value also tends to increase with respect to the increase in the voltage value. This is true of the case where the gate voltage is swept by taking the back gate voltage as reference in an accumulation type MOS capacitance element having the N+ electrode formed on the N-well layer. In the case where a P+ electrode is provided on a P-well layer or the case where the back gate voltage is swept by taking the gate voltage as reference, the increase tendency of the capacitance characteristic curve becomes the opposite as well.

Various circuit forms for conducting external frequency adjustment or frequency temperature compensation of TCXO by utilizing the capacitance characteristics of the MOS capacitance element as described above have been proposed. Hereinafter, examples of them will be described with reference to the drawings.

FIG. 20 shows a first oscillation circuit example using a MOS capacitance element. In the example, a crystal resonator X, an indirect type temperature compensation circuit, a direct current blocking capacitor C1, an external frequency adjustment circuit, and a direct current blocking capacitor C2 are connected in series with an amplifier. In the external frequency adjustment circuit shown in FIG. 20, a reference voltage signal Varef from an external control circuit is supplied to the back gate electrode side of a MOS capacitance element MA for external control (hereinafter referred to as MA for external) via an input resistor R1. An external control voltage signal Vafc from the external control circuit is supplied to the gate electrode side of the MA for external via an input resistor R2.

In the indirect type temperature compensation circuit shown in FIG. 20, a reference voltage signal Vref is supplied to a back gate electrode of a MOS capacitance element MC for temperature compensation (hereinafter referred to as MC for compensation) via an input resistor R3. A control voltage signal Vco for compensation is supplied to the gate electrode via an input resistor R4. Lines of the reference voltage signal Vref and the control voltage signal Vco for compensation are connected to a control circuit. The control circuit is connected to a thermo-sensitive element such as a thermistor.

A MOS capacitance element having capacitance characteristics shown in FIG. 13 in which Cgb increases as Vgb increases is used in each of the MA for external and the MC for compensation. As for the MA for external, the external control voltage signal Vafc is applied so as to change from the minus side to the plus side with the reference voltage signal Varef taken as the reference. As for the MC for compensation as well, the control voltage signal Vco is applied so as to change from the minus side to the plus side with the reference voltage signal Vref taken as the reference. At this time, characteristics in which the frequency deviation decreases as Vgb increases as shown in FIG. 21 are obtained.

Here, in the external frequency adjustment circuit, it becomes possible to conduct adjustment so as to obtain an arbitrary frequency in a frequency control range by supplying a corresponding external control voltage signal from the external control circuit. Furthermore, at this time, the variable frequency characteristics shown in FIG. 21 become a gentle change as compared with the steep capacitance value change of the MOS capacitance element shown in FIG. 13, and fine frequency adjustment using the external control voltage signal Vafc becomes possible.

On the other hand, in the indirect type temperature compensation circuit, a control voltage signal changing in the same way as arbitrary frequency characteristics of the crystal resonator which change curvilinearly with respect to the temperature is supplied to the MC for compensation by the control circuit. The control voltage signal to be supplied is previously stored as digital data in a ROM or the like which is not illustrated. The data is read out on the basis of information of the ambient temperature measured by the thermo-sensitive element connected to the control circuit, and the control voltage signal is generated.

It is now supposed that frequency temperature characteristics of a crystal resonator (AT cut) as shown in FIG. 22 is to be compensated. In the frequency temperature characteristics, the frequency decreases curvilinearly as the temperature falls at low temperatures lower than the normal temperature (for example, 25° C.). The frequency changes little near the normal temperature. At high temperatures higher than the normal temperature, the frequency increases curvilinearly as the temperature rises. Thus, the frequency temperature characteristics are represented by a cubic curve.

If in the indirect type temperature compensation circuit a control voltage signal having similar cubic curve characteristics with respect to the temperature is supplied to the MC for compensation by the control circuit, a load capacitance curve which cancels the frequency temperature characteristics of the cubic curve shown in FIG. 22 can be obtained and it becomes possible to conduct temperature compensation of the frequency.

In this system, however, a control voltage signal having the cubic curve to be supplied is derived in an analog way. Therefore, it is necessary to implement a complicated logic circuit by freely using IC techniques.

A temperature compensation system of TCXO utilizing a curvilinear capacitance change that the MOS capacitance element originally has, when conducting temperature compensation for the crystal resonator having the cubic curve shown in FIG. 22 is disclosed in Japanese Patent Application Laid-Open No. 2001-060828 (Patent literature 1) filed by the present applicant. Hereinafter, its principle will be described briefly with reference to drawings.

In the above-described characteristics of the MOS capacitance element, the characteristic curve is shifted to the right as shown in FIG. 23(A) by previously applying a bias from the gate electrode to the back gate electrode by a built-in voltage generated between the N-well layer 102 and the intrinsic semiconductor. Thus, two MOS capacitance elements having characteristics which become nearly point-symmetrical at a point at which Vgb is 0 V are used.

In other words, one of the MOS capacitance elements denoted by 121 in FIG. 23(A) having Vgb mainly on the plus side is used for compensation at the normal temperature and at temperatures lower than the normal temperature. The other of the MOS capacitance elements denoted by 122 in FIG. 23(A) having Vgb mainly on the minus side is used for compensation at the normal temperature and at temperatures higher than the normal temperature. The compensation signal can be taken out continuously with respect to the ambient temperature change.

As a result, load capacitance characteristics which cancel the frequency temperature characteristics in the crystal resonator shown in FIG. 22 are obtained as shown in FIG. 23B. Thus, it becomes possible to conduct the temperature compensation of the frequency.

A second oscillation circuit example using a frequency temperature compensation circuit that implements this configuration is shown in FIG. 24. In this example, a crystal resonator X and a serial temperature compensation circuit are connected in series with an amplifier.

The serial temperature compensation circuit shown in FIG. 24 is obtained by connecting a parallel circuit compose of a MOS capacitance element MH for compensation at high temperatures (hereinafter referred to as MH for high temperatures) serving as a first MOS capacitance element and a capacitor C1 for adjustment serving as a first fixed capacitance element, in series with a series circuit composed of a MOS capacitance element ML for compensation at low temperatures (hereinafter referred to as ML for low temperatures)

serving as a second MOS capacitance element and a capacitor C2 for direct current blocking and adjustment serving as a second fixed capacitance element.

A node between a back gate electrode of the ML for low temperatures and the capacitor C2 is supplied with a low temperature control voltage signal VL serving as a second control voltage signal via an input resistor R1. A gate electrode of the MH for high temperatures is supplied with a high temperature control voltage signal VH serving as a first control voltage signal via an input resistor R2. A gate electrode of the ML for low temperatures is connected to a back gate electrode of the MH for high temperatures. A node between them is supplied with a reference voltage signal Vref via an input resistor R3.

Lines of the low temperature control voltage signal VL, the high temperature control voltage signal VH and the reference voltage signal Vref are connected to a control circuit. The control circuit is connected to a thermo-sensitive element such as a thermistor.

As the ambient temperature changes from a low temperature to a high temperature via the normal temperature, the back gate electrode of the ML for low temperatures is supplied with the low temperature control voltage signal VL which decreases linearly from nearly 0V to the minus side in potential difference from the reference voltage signal Vref input to the gate electrode of the ML for low temperatures (which is equivalent to a linear increase of Vgb from nearly 0 V to the plus side in FIG. 23(A)) by the control circuit connected to the thermo-sensitive element shown in FIG. 24. On the other hand, as the ambient temperature changes from a low temperature to a high temperature via the normal temperature, the gate electrode of the MH for high temperatures is supplied with the high temperature control voltage signal VH which increases linearly from the minus side to nearly 0 V in potential difference from the reference voltage signal Vref input to the back gate electrode of the MH for high temperatures (which is equivalent to a linear increase of Vgb from the minus side to nearly 0 V in FIG. 23(A)).

As for the capacitance change in the ML for low temperatures, the capacitance steeply increases as the temperature changes from low temperatures to the normal temperature, and the capacitance change becomes slight at the normal temperature and temperatures higher than the normal temperature. On the other hand, as for the capacitance change in the MH for high temperatures, it is slight at low temperatures and near the normal temperature, and the capacitance increases steeply as the temperature changes from the normal temperature to high temperatures. Therefore, a series composite capacitance value of the ML for low temperatures and the MH for high temperatures do not interfere in respective compensation temperature ranges. And it becomes possible to obtain an arbitrary load capacitance curve as shown in FIG. 23(B) by adjusting values of the capacitor C2 connected in series with the ML for low temperatures and the capacitor C1 connected in parallel with the MH for high temperatures.

[Patent literature 1] Japanese Patent Application Laid-Open No. 2001-060828

SUMMARY OF THE INVENTION

In the above-described capacitance characteristics of the accumulation type MOS capacitance element, however, there is a region where Cgb is unstable with time in low capacitance value region (hereinafter referred to as Cmin region) shown in FIG. 25. (Here, values of Vgb in (1) to (6) shown in FIG. 25 coincide with respective values shown in FIG. 13.) Immediately after Vgb is instantaneously changed from the plus side as compared with the Cmin region into the Cmin region, Cgb becomes a value on a dotted line 202 slightly lower than a value on a solid line 201 which represents characteristics in a steady state shown in FIG. 25. Thereinafter, Cgb gradually returns to a value on the solid line 201. The unstable region is caused by this phenomenon. The cause of this phenomenon is considered as follows. Immediately after Vgb is instantaneously changed from a potential on the plus side as compared with (4) shown in FIG. 25 to, for example, (5), holes forming the inversion layer 110 shown in FIG. 18 and described earlier are not generated and the width of the depletion layer 109 increases. Thereinafter, holes thermally excited in a definite time constitute the inversion layer 110. As a result, the depletion layer 109 corresponding to the total charge quantity of the holes disappears and its width decreases. This is considered to be the cause of the above-described phenomenon. Time required for this phenomenon is considered to be time for holes which are minority carriers in the depletion layer to reach the thermal equilibrium state.

FIG. 26 shows an experimental result obtained by checking the states of the unstable capacitance characteristics in the Cmin region. All of the MOS capacitance elements used in experiments 1 to 4 shown in FIG. 26 are the same MOS capacitance element. The ordinate indicates the capacitance value. The abscissa indicates the leaving time. The frequency used to measure the capacitance value is 1 MHz. Vgb is left at the initial voltage +4 V for approximately 2 minutes. Thereinafter, Vgb is instantaneously changed to −4 V in an experiment 1, to −3 V in an experiment 2, −2 V in an experiment 3, and −1 V in an experiment 4. Respective capacitance values which change with leaving time from the instant are recorded.

In a graph in the experiment 1, the capacitance value gradually increases from the instant Vgb is changed from the initial voltage +4 V to −4 V. After approximately 100 seconds have elapsed, the capacitance value converges to a fixed value, i.e., approximately 9 pF. From the graph in the experiment 1, it is appreciated that the capacitance value obtained at the instant Vgb is changed to −4 V is approximately 18% lower than the capacitance value in the steady state in which Vgb is at −4 V. In the experiment 2, the experiment 3, and the experiment 4 as well, the capacitance value obtained at the instant Vgb is changed from the initial voltage respectively to −3 V, −2 V and −1 V is lower than the capacitance value in the steady state. At −3V, the capacitance value is approximately 17% lower than the capacitance value in the steady state. At −2 V, the capacitance value is approximately 14% lower than the capacitance value in the steady state. At −1V, the capacitance value is approximately 7% lower than the capacitance value in the steady state. Thereinafter, the respective capacitance values converge to the value in the steady state in approximately 100 seconds.

According to these experiments, it has been found that the decrease at the instant Vgb is changed becomes greater as Vgb becomes lower in the Cmin region (as the capacitance value in the steady state becomes lower) and the time required to converge to the steady state thereinafter is approximately 100 seconds in the whole region of Cmin. (In the experiments, the initial voltage is +4 V. However, it has been ascertained that the characteristics do not depend on the value of the initial voltage and similar results are obtained by setting the initial voltage equal to an arbitrary voltage value on the plus side as compared with the Cmin region.)

If the conventional accumulation type MOS capacitance element having unstable characteristics in the Cmin region is used in the MA for external and the MC for compensation shown in FIG. 20, the Cmin unstable region shown in FIG. 25 affects even a region 203 shown in FIG. 27 which is a variable frequency region, because the variable frequency characteristics are gentler than the capacitance change of the MOS capacitance element which is steep as described above. This becomes a cause of instability in the external variable frequency characteristics and the indirect type frequency temperature compensation characteristics with time.

If the conventional accumulation type MOS capacitance element having unstable characteristics in the Cmin region is used in the serial temperature compensation circuit shown in FIG. 24, it becomes a cause of instability in load capacitance at temperatures near the normal temperature in the MH for high temperatures as described above, i.e., a cause of instability in frequency deviation at the normal temperature, resulting in a serious problem.

In order to solve the problems, the invention according to a first aspect provides a piezoelectric oscillator having a structure obtained by connecting an amplifier, an external frequency adjustment circuit, and a piezoelectric element (piezoelectric resonator) in series, wherein the external frequency adjustment circuit is a variable capacitance circuit using a MOS capacitance element and voltage, and has a configuration for supplying a reference signal having a constant voltage value to a back gate electrode of the MOS capacitance element and supplying a control signal around the reference signal to a gate electrode of the MOS capacitance element, the MOS capacitance element is a channel transistor of a second conductivity type formed in a well region of a first conductivity type, the second conductivity type being opposite to the first conductivity type, and a bias voltage is supplied between an extraction electrode of the second conductivity type formed in source and drain regions of the channel transistor of the second conductivity type and an extraction electrode of the first conductivity type formed in the well region of the first conductivity type.

The invention according to a second aspect provides a piezoelectric oscillator having a structure obtained by connecting an amplifier, a temperature compensation circuit, and a piezoelectric element in series, wherein the temperature compensation circuit is a variable capacitance circuit using a MOS capacitance element and voltage, and has a configuration for supplying a reference signal having a constant voltage value to a back gate electrode of the MOS capacitance element and supplying a control signal for compensation around the reference signal to a gate electrode of the MOS capacitance element, the MOS capacitance element is a channel transistor of a second conductivity type formed in a well region of a first conductivity type, the second conductivity type being opposite to the first conductivity type, and a bias voltage is supplied between an extraction electrode of the second conductivity type formed in source and drain regions of the channel transistor of the second conductivity type and an extraction electrode of the first conductivity type formed in the well region of the first conductivity type.

The invention according to a third aspect provides a piezoelectric oscillator having a structure obtained by connecting an amplifier, a temperature compensation circuit, and a piezoelectric element in series, wherein the temperature compensation circuit is a variable capacitance circuit using two MOS capacitance elements connected in series and voltage, and has a structure obtained by connecting a parallel circuit composed of a first MOS capacitance element and a first fixed capacitance element in series with a serial circuit composed of a second MOS capacitance element and a second fixed capacitance element so as to connect a back gate electrode of the first MOS capacitance element to a gate electrode of the second MOS capacitance element, the temperature compensation circuit has a configuration for supplying a reference signal having a constant voltage value to a node between the back gate electrode of the first MOS capacitance element and the gate electrode of the second MOS capacitance element, supplying a first control signal to a gate electrode of the first MOS capacitance element, and supplying a second control signal to a back gate electrode of the second MOS capacitance element, both the first and second MOS capacitance elements are channel transistors of a second conductivity type formed in a well region of a first conductivity type, the second conductivity type being opposite to the first conductivity type, and a bias voltage is supplied between an extraction electrode of the second conductivity type formed in source and drain regions of the channel transistor of the second conductivity type and an extraction electrode of the first conductivity type formed in the well region of the first conductivity type.

The invention according to a fourth aspect provides a piezoelectric oscillator having a structure obtained by connecting an amplifier, a temperature compensation circuit, and a piezoelectric element in series, wherein the temperature compensation circuit is a variable capacitance circuit using first and second MOS capacitance elements connected in parallel and voltage, and has a structure obtained by connecting a serial circuit composed of the second MOS capacitance element and a fixed capacitance element in parallel with the first MOS capacitance element so as to connect a gate electrode of the second MOS capacitance element to a back gate electrode of the first MOS capacitance element, the temperature compensation circuit has a configuration for supplying a reference signal having a constant voltage value to a node between the gate electrode of the second MOS capacitance element and the back gate electrode of the first MOS capacitance element, supplying a second control signal to a back gate electrode of the second MOS capacitance element, and supplying a first control signal to a gate electrode of the first MOS capacitance element, both the first and second MOS capacitance elements are channel transistors of a second conductivity type formed in a well region of a first conductivity type, the second conductivity type being opposite to the first conductivity type, and a bias voltage is supplied between an extraction electrode of the second conductivity type formed in source and drain regions of the channel transistor of the second conductivity type and an extraction electrode of the first conductivity type formed in the well region of the first conductivity type.

The invention according to a fifth aspect provides the piezoelectric oscillator according to any one of the first to fourth aspects, wherein all connection senses of the gate electrodes and the back gate electrodes of the respective MOS capacitance elements are inverted.

The invention according to a sixth aspect provides the piezoelectric oscillator according to any one of the first to fifth aspects, wherein the first conductivity type is N-type, and the second conductivity type is P-type. The invention according to a seventh aspect provides the piezoelectric oscillator according to any one of the first to fifth aspects, wherein the first conductivity type is P-type, and the second conductivity type is N-type.

According to the present invention, in the channel transistor of the first conductivity type or the channel transistor of the second conductivity type, a bias voltage is applied between extraction electrodes of the first conductivity type or the second conductivity type formed in source and drain regions and an extraction electrode of the first conductivity type provided in a well region of the first conductivity type or an extraction electrode of the second conductivity type provided in a well region of the second conductivity type. As a result, instability in the MOS capacitance element with time in a low capacitance value range is improved.

By utilizing the improved MOS capacitance element in a temperature compensation circuit as disclosed in Japanese Patent Application Laid-Open No. 2001-060828 (Patent literature 1) or an external control circuit, it has become possible to stabilize the frequency characteristics at the normal temperature with time in the temperature compensation circuit, and stabilize the frequency control characteristics in a wide applied voltage range with time in the external control circuit.

BRIEF DESCRIPTION OF THE DRAWINGS

FIG. 1 is a structure diagram of a P-channel transistor type MOS capacitance element;

FIG. 2 is a diagram showing capacitance characteristics of a P-channel transistor type MOS capacitance element;

FIG. 3 is a schematic diagram of electric charge in a P-channel transistor type MOS capacitance element;

FIG. 4 is a schematic diagram of electric charge in a P-channel transistor type MOS capacitance element;

FIG. 5 is a schematic diagram of electric charge in a P-channel transistor type MOS capacitance element;

FIG. 6 is a schematic diagram of electric charge in a P-channel transistor type MOS capacitance element;

FIG. 7 is a schematic diagram of electric charge in a P-channel transistor type MOS capacitance element;

FIG. 8 is a schematic diagram of electric charge in a P-channel transistor type MOS capacitance element;

FIG. 9 is a diagram showing a third oscillation circuit example utilizing a MOS capacitance element;

FIG. 10 is a structure diagram of an N-channel transistor type MOS capacitance element;

FIG. 11 is a diagram showing capacitance characteristics of an N-channel transistor type MOS capacitance element;

FIG. 12 is a structure diagram of an accumulation type MOS capacitance element;

FIG. 13 is a diagram showing capacitance characteristics 1 of an accumulation type MOS capacitance element;

FIG. 14 is a schematic diagram of electric charge in an accumulation type MOS capacitance element;

FIG. 15 is a schematic diagram of electric charge in an accumulation type MOS capacitance element;

FIG. 16 is a schematic diagram of electric charge in an accumulation type MOS capacitance element;

FIG. 17 is a schematic diagram of electric charge in an accumulation type MOS capacitance element;

FIG. 18 is a schematic diagram of electric charge in an accumulation type MOS capacitance element;

FIG. 19 is a schematic diagram of electric charge in an accumulation type MOS capacitance element;

FIG. 20 is a diagram showing a first oscillation circuit example utilizing a MOS capacitance element;

FIG. 21 is a diagram showing variable frequency characteristics 1 utilizing MOS capacitance characteristics;

FIG. 22 is a diagram showing frequency temperature characteristics of a crystal resonator (AT cut);

FIG. 23 is a diagram showing a mechanism for obtaining cubic curve load capacitance characteristics from MOS capacitance characteristics;

FIG. 24 is a diagram showing a second oscillation circuit example utilizing a MOS capacitance element;

FIG. 25 is a diagram showing capacitance characteristics 2 of an accumulation type MOS capacitance element;

FIG. 26 is a diagram showing Cmin capacitance value leaving experiments; and

FIG. 27 is a diagram showing variable frequency characteristics 2 utilizing MOS capacitance characteristics.

EXPLANATION OF THE CODES

C1, C2, C3—Capacitor, R1, R2, R3, R4, R5—Input resistor, MC, MA, ML, MH—MOS capacitance element, VL, VH, Vref, Varef—Control signal, X—Crystal resonator

DESCRIPTION OF THE PREFERRED EMBODIMENTS

FIG. 1 is a structure diagram of a P-channel (Pch) transistor type MOS capacitance element provided in an IC utilized for the present invention. In FIGS. 1 to 9, a first conductivity type is N-type and a second conductivity type is P-type.

In FIG. 1, a silicon substrate (P-Sub) 1 of the second conductivity type (P-type) is grounded. A well region of the first conductivity type which is the conductivity type opposite to the second conductivity type (hereinafter referred to as N-well layer) 2 is formed on the P-sub 1. A gate oxide film layer 3 including oxide silicon which serves as an insulator is formed on the N-well layer 2. A gate electrode layer 4 including polysilicon is formed on the gate oxide film layer 3. A gate electrode is taken out from the gate electrode layer 4 as an external terminal. Extraction electrodes 5 of the second conductivity type (P-type) having a high acceptor impurity concentration (drain and source regions in a MOS transistor) are formed in two places on the N-well layer 2 near the gate oxide film layer 3. Depletion layers 6 including PN junctions are formed at interfaces between the P-type extraction electrodes 5 and the surrounding N-well layer 2. An N+ extraction electrode 7 having a high donor impurity concentration is formed on the N-well layer 2. A back gate electrode is extracted to the outside from the N+ extraction electrode 7. A bias voltage is supplied by a power supply 9 with a node 8 obtained by short-circuiting the two P-type extraction electrodes 5 being connected to its minus side and the back gate electrode being connected to its plus side. The node 8 is grounded.

FIG. 2 shows an example of characteristics of a capacitance value Cgb generated between the back gate electrode and the gate electrode in the P-channel transistor type MOS capacitance element (hereinafter referred to as Cgb in the same way as the foregoing description) as a function of the gate voltage Vgb measured from the back gate voltage (hereinafter referred to as Vgb in the same way as the foregoing description). In the same way as the accumulation type MOS capacitance element described in the background art, on the characteristic curve, Cgb assumes a high constant value when Vgb represented by the abscissa is on the plus side. If Vgb decreases and becomes lower than 0V, Cgb steeply decreases. If Vgb has decreased to a certain value, Cgb becomes stable at a low constant value.

As a matter of fact, the characteristics curve shifts to the left or right by a flat band voltage Vfb in the same way as the foregoing description.

Hereinafter, a relative change of electric charge quantity in the gate electrode layer 4 and the N-well layer 2 caused when Vgb is decreased successively from (1) to (6) shown in FIG. 2 will be described in detail as a change in number of holes or electrons with reference to schematic drawings.

FIG. 3 is a schematic diagram showing relative electric charge states in the gate electrode layer 4 and the N-well layer 2 when Vgb nearly assumes a value on the plus side corresponding to (1) shown in FIG. 2 and Cgb assumes a high stable constant value. Holes 11 are stored in the gate electrode layer 4 shown in FIG. 3 because Vgb is on the plus side.

Electrons which are majority carriers in the N-well layer 2 attracted to an electric field of the holes 11 are stored under the gate oxide film layer 3 by an amount of electric charge quantity equivalent to the total electric charge quantity of the holes 11. Thus, an electrode storage layer 12 is formed. Therefore, capacitance Cgb which is in inverse proportion to the thickness of the gate oxide film layer 3 is generated here (hereinafter it is referred to as gate oxide film capacitance in the same way as the foregoing description).

FIG. 4 shows a state in which Vgb has decreased to a value nearly corresponding to (2) shown in FIG. 2. The holes stored in the gate electrode layer 4 decrease, and consequently the electron storage layer 12 attracted under the gate oxide film layer 3 also decreases. Cgb generated by the value of Vgb between (1) and (2) shown in FIG. 2 is gate oxide film capacitance, and it becomes a constant value.

FIG. 5 shows a state in which Vgb has decreased to a value slightly on the minus side than 0 V nearly corresponding to (3) shown in FIG. 2. The holes 11 (see FIG. 4) stored in the gate electrode layer 4 are replaced by electrons 13. Consequently, the electrons (see FIG. 4) in the electron storage layer 12 and free electrons stored in the N-well layer 2 under and near the gate oxide film layer 3 are emitted into a deep layer in the N-well layer 2. Therefore, a depletion layer 14 including donor ions is formed under the gate oxide film layer 3. Accordingly, Cgb becomes series composite capacitance value of the gate oxide film layer capacitance and depletion layer capacitance, and it consequently decreases.

FIG. 6 shows a state in which Vgb has decreased to a value nearly corresponding to (4) shown in FIG. 2. At this time, the depletion layer 14 expands its width as the electrons 13 in the gate electrode layer 4 increases. The value of Cgb is steeply decreased by an increase in the depletion layer width caused by the decrease in Vgb.

In the schematic diagrams shown in FIGS. 5 and 6, electrons 13 are stored in the gate electrode by the change of Vgb to the minus side. However, a sufficient bias voltage from the grounded P-type extraction electrode 5 is supplied to the back gate electrode by the power supply 9. Even if the gate potential is lowered by lowering in Vgb, therefore, the so-called threshold voltage is not exceeded. Therefore, holes are prevented from flowing from the P-type extraction electrode 5 into a region under the gate oxide film layer 3 to form a P-channel.

FIG. 7 shows a state in which Vgb is further decreased to a value nearly corresponding to (5) in FIG. 2 at which Vgb becomes a certain value (a value at which a voltage that is twice as high as built-in voltage generated between the N-well layer 2 and the intrinsic semiconductor is applied to the depletion layer 14, as described above) or less. In the depletion layer 14 at this time, holes which are minority carriers are generated by thermally generated electron-hole pairs in the same way as the accumulation type as described above. The generated holes are absorbed into the P-type extraction electrode 5 and emitted to GND. Therefore, an inversion layer is not formed under the gate oxide film layer 3, and the width of the depletion layer increases. Even if Vgb instantaneously changes into the Cmin unstable region in the accumulation type shown in FIG. 2, therefore, Cgb becomes a value on a solid line shown in FIG. 2 and does not change, because holes which are minority carriers are always in the thermal equilibrium state.

FIG. 8 shows a state in which Vgb is further decreased to a value nearly corresponding to (6) shown in FIG. 2. In this case as well, an inversion layer is not formed in the same way as the foregoing description and the width of the depletion layer increases. Accordingly, instability in the Cmin region seen in the conventional accumulation type is improved.

The example shown in FIG. 2 has been described supposing that the flat band voltage Vfb is 0 V for brevity. As described with reference to the accumulation type, however, characteristic curves which are nearly point-symmetrical at the 0 V point can be obtained by previously applying a bias from the gate electrode to the back gate electrode by a built-in voltage generated between the N-well layer 2 and the intrinsic semiconductor and shifting a characteristic curve to the right as shown in FIG. 23(A). If the P-channel transistor type MOS capacitance element is incorporated as the MA for external and the MC for compensation shown in FIG. 20, therefore, external variable frequency characteristics and temperature compensation characteristics that are stable with time are implemented. If the P-channel transistor type MOS capacitance element is incorporated in the serial temperature compensation circuit shown in FIG. 24, frequency characteristics at the normal temperature that is stable with time are implemented.

Examples of a third oscillation circuit utilizing the P-channel type MOS capacitance element are shown in FIGS. 9(A) and 9(B).

In the examples, a crystal resonator X, a parallel temperature compensation circuit, and a direct current blocking capacitor C1 are connected in series with an amplifier.

A parallel temperature compensation circuit shown in FIG. 9(A) is formed by connecting a MOS capacitance element MH for compensation at high temperatures (hereinafter referred to as MH for high temperatures in the same way as the foregoing description) which is a first MOS capacitance element in parallel with a series circuit composed of a MOS capacitance element ML for compensation at low temperatures (hereinafter referred to as ML for low temperatures in the same way as the foregoing description) which is a second MOS capacitance element and a capacitor C2 for direct current blocking and adjustment which is a fixed capacitance element.

A node between a back gate electrode of the ML for low temperatures and the capacitor C2 is supplied with a low temperature control voltage signal VL which is a second control signal via an input resistor R1. A gate electrode of the MH for high temperatures is supplied with a high temperature control voltage signal VH which is a first control signal via an input resistor R2. A gate electrode of the ML for low temperatures and a back gate electrode of the MH for high temperatures are connected to each other. The node is supplied with a reference signal (reference voltage signal) Vref via an input resistor R3.

Respective lines of the low temperature control voltage signal VL, the high temperature control voltage signal VH, and the reference signal Vref are connected to a control circuit, respectively. The control circuit is connected to a thermo-sensitive element including a thermistor or the like.

Operation of the parallel temperature compensation circuit is described in detail in an application for a patent already filed by the present applicant. Each of capacitance values of the ML for low temperatures and the MH for high temperatures with respect to the ambient temperature changes according to a principle similar to contents described with reference to the serial temperature compensation circuit. Changes of the parallel composite capacitance values do not interfere in respective compensation temperature ranges in the same way as the serial temperature compensation circuit, and an arbitrary load capacitance curve as shown in FIG. 23(B) is implemented.

In the third oscillation circuit example as well, therefore, the Cmin instability is improved and stable temperature compensation characteristics of the frequency at the normal temperature can be obtained in the same way as the serial temperature compensation circuit.

Even if a MOS capacitance element shown in FIG. 2 having an N-channel transistor obtained by inverting the conductivity type of a semiconductor is incorporated in the first oscillation circuit example, the second oscillation circuit example, or the third oscillation circuit example, effects similar to those in the foregoing description can be anticipated.

FIG. 9(B) is a modification example of an oscillator shown in FIG. 9(A). FIG. 9(B) differs from FIG. 9(A) in that senses of connections of the gate electrodes and the back gate electrodes of the MOS capacitance element MH for compensation at high temperatures which is the first MOS capacitance of the oscillator circuit and the MOS capacitance element ML for compensation at low temperatures which is the second MOS capacitance element of the oscillator circuit are inverted.

By supplying first and second control signals in such a configuration, temperature compensation similar to FIG. 9(A) can be conducted.

FIG. 10 shows a structure diagram of an N-channel transistor type MOS capacitance element provided in an IC. FIG. 11 shows a characteristic curve of its capacitance change. By the way, in FIGS. 10 and 11, the first conductivity type is the P-type and the second conductivity type is the N-type.

The capacitance characteristic curve shown in FIG. 11 exhibits increase tendency opposite to that in characteristics of the P-channel transistor type MOS capacitance element. In the characteristics, Cgb assumes a high constant value when Vgb is on the minus side. Cgb steeply decreases as Vgb increases. Cgb becomes stable at a low constant value when Vgb has increased to a certain value.

FIG. 10 is a schematic diagram schematically showing relative electric charge changes in a gate electrode layer 24 and a P-well layer 22 when Vgb nearly assumes a value corresponding to (1) shown in FIG. 11, as a change in the number of holes or electrons.

In FIG. 10, a silicon substrate (N-Sub) 21 of the second conductivity type (N-type) is connected to a power supply having a voltage Vdd. A well region of the first conductivity type (hereinafter referred to as P-well layer) 22 is formed on the N-sub 21. A gate oxide film layer 23 including oxide silicon which serves as an insulator is formed on the P-well layer 22. A gate electrode layer 24 including polysilicon is formed on the gate oxide film layer 23. A gate electrode is taken out from the gate electrode layer 24 as an external terminal. Extraction electrodes 25 of the second conductivity type (N-type) having a high donor impurity concentration (drain and source regions in a MOS transistor) are formed in two places on the P-well layer 22 near the gate oxide film layer 23. Depletion layers 26 including PN junctions are formed at interfaces between the N-type extraction electrodes 25 and the surrounding P-well layer 22.

And a P+ extraction electrode 27 having a high acceptor impurity concentration is formed on the P-well layer 22. A back gate electrode is extracted to the outside from the P+ extraction electrode 27. A bias voltage is supplied by a power supply 29 with a node 28 obtained by short-circuiting the two N-type extraction electrodes 25 being connected to its plus side and the back gate electrode being connected to its minus side. (The bias is opposite to the bias of the P-channel transistor type.) The node 28 is connected to the power supply.

Holes 30 are stored in the gate electrode layer 24 shown in FIG. 10, because Vgb is on the plus side. Holes stored in the P-well layer under and near the gate oxide film 23 are emitted into a deep layer in the P-well layer by an electric field of the holes 30. A depletion layer 31 including acceptor ions is formed. In the depletion layer 31, electrons which are minority carriers are generated by thermally generated electron-hole pairs in the same way as the foregoing description. The generated electrons are absorbed into the N-type extraction electrode 25. Therefore, an inversion layer is not formed, and the instability in the Cmin region is improved.

In the same way as the above-described P-channel transistor type, a sufficient bias voltage from the back gate electrode is supplied to the N-type extraction electrode 25 by the power supply 29. Even if the gate potential is raised by an increase in Vgb, therefore, the so-called threshold voltage is not exceeded. Therefore, an N-channel is not formed.

In the same way as contents described with reference to capacitance characteristics of the P-channel transistor type MOS capacitance element, characteristic curves which are nearly point-symmetrical at the 0 V point of Vgb can be obtained by previously applying a bias from the gate electrode to the back gate electrode by a built-in voltage generated between the N-well layer 22 and the intrinsic semiconductor and shifting a characteristic curve to the right in FIG. 11. The characteristic curves can also be utilized in the temperature compensation circuit described with reference to the second oscillation circuit example or the third oscillation circuit example.

As a matter of course, the invention can be applied not only to a crystal oscillator using a crystal resonator, but also to a piezoelectric oscillator using another piezoelectric element (piezoelectric resonator) using, for example, ceramics or langasite.

The invention claimed is:

1. A piezoelectric oscillator having a structure obtained by connecting an amplifier, an external frequency adjustment circuit, and a piezoelectric element in series, wherein
    the external frequency adjustment circuit is a variable capacitance circuit using a MOS capacitance element and voltage, and has a configuration for supplying a reference signal having a constant voltage value to a back gate electrode of the MOS capacitance element and supplying a control signal around the reference signal to a gate electrode of the MOS capacitance element,
    the MOS capacitance element is a channel transistor of a second conductivity type formed in a well region of a first conductivity type, the second conductivity type being opposite to the first conductivity type, and
    a bias voltage is supplied between an extraction electrode of the second conductivity type formed in source and drain regions of the channel transistor of the second conductivity type and an extraction electrode of the first conductivity type formed in the well region of the first conductivity type.

2. A piezoelectric oscillator having a structure obtained by connecting an amplifier, a temperature compensation circuit, and a piezoelectric element in series, wherein
    the temperature compensation circuit is a variable capacitance circuit using a MOS capacitance element and voltage, and has a configuration for supplying a reference signal having a constant voltage value to a back gate electrode of the MOS capacitance element and supplying a control signal for compensation around the reference signal to a gate electrode of the MOS capacitance element,
    the MOS capacitance element is a channel transistor of a second conductivity type formed in a well region of a first conductivity type, the second conductivity type being opposite to the first conductivity type, and a bias voltage is supplied between an extraction electrode of the second conductivity type formed in source and drain regions of the channel transistor of the second conductivity type and an extraction electrode of the first conductivity type formed in the well region of the first conductivity type.

3. A piezoelectric oscillator having a structure obtained by connecting an amplifier, a temperature compensation circuit, and a piezoelectric element in series, wherein the temperature compensation circuit is a variable capacitance circuit using two MOS capacitance elements connected in series and voltage, and has a structure obtained by connecting a parallel circuit composed of a first MOS capacitance element and a first fixed capacitance element in series with a serial circuit composed of a second MOS capacitance element and a second fixed capacitance element so as to connect a back gate electrode of the first MOS capacitance element to a gate electrode of the second MOS capacitance element, the temperature compensation circuit has a configuration for supplying a reference signal having a constant voltage value to a node between the back gate electrode of the first MOS capacitance element and the gate electrode of the second MOS capacitance element, supplying a first control signal to a gate electrode of the first MOS capacitance element, and supplying a second control signal to a back gate electrode of the second MOS capacitance element, both the first and second MOS capacitance elements are channel transistors of a second conductivity type formed in a well region of a first conductivity type, the second conductivity type being opposite to the first conductivity type, and a bias voltage is supplied between an extraction electrode of the second conductivity type formed in source and drain regions of the channel transistor of the second conductivity type and an extraction electrode of the first conductivity type formed in the well region of the first conductivity type.

4. A piezoelectric oscillator having a structure obtained by connecting an amplifier, a temperature compensation circuit, and a piezoelectric element in series, wherein the temperature compensation circuit is a variable capacitance circuit using first and second MOS capacitance elements connected in parallel and voltage, and has a structure obtained by connecting a serial circuit composed of the second MOS capacitance element and a fixed capacitance element in parallel with the first MOS capacitance element so as to connect a gate electrode of the second MOS capacitance element to a back gate electrode of the first MOS capacitance element, the temperature compensation circuit has a configuration for supplying a reference signal having a constant voltage value to a node between the gate electrode of the second MOS capacitance element and the back gate electrode of the first MOS capacitance element, supplying a second control signal to a back gate electrode of the second MOS capacitance element, and supplying a first control signal to a gate electrode of the first MOS capacitance element, both the first and second MOS capacitance elements are channel transistors of a second conductivity type formed in a well region of a first conductivity type, the second conductivity type being opposite to the first conductivity type, and a bias voltage is supplied between an extraction electrode of the second conductivity type formed in source and drain regions of the channel transistor of the second conductivity type and an extraction electrode of the first conductivity type formed in the well region of the first conductivity type.

5. The piezoelectric oscillator according to any one of claims 1 to 4, wherein all connection senses of the gate electrodes and the back gate electrodes of the respective MOS capacitance elements are inverted.

6. The piezoelectric oscillator according to any one of claims 1 to 4, wherein the first conductivity type is N-type, and the second conductivity type is P-type.

7. The piezoelectric oscillator according to any one of claims 1 to 4, wherein the first conductivity type is P-type, and the second conductivity type is N-type.

8. The piezoelectric oscillator according to claim 5, wherein the first conductivity type is N-type, and the second conductivity type is P-type.

9. The piezoelectric oscillator according to claim 5, wherein the first conductivity type is P-type, and the second conductivity type is N-type.

* * * * *